United States Patent
Kim et al.

(10) Patent No.: US 11,656,496 B2
(45) Date of Patent: May 23, 2023

(54) DISPLAY APPARATUS

(71) Applicant: SAMSUNG ELECTRONICS CO., LTD., Suwon-si (KR)

(72) Inventors: Sungyeol Kim, Suwon-si (KR); Kyehoon Lee, Suwon-si (KR); Youngmin Lee, Suwon-si (KR); Junsung Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/542,917

(22) Filed: Dec. 6, 2021

(65) Prior Publication Data
US 2023/0036292 A1 Feb. 2, 2023

Related U.S. Application Data

(63) Continuation of application No. PCT/KR2021/015075, filed on Oct. 26, 2021.

(30) Foreign Application Priority Data

Jul. 29, 2021 (KR) .................. 10-2021-0100148

(51) Int. Cl.
G02F 1/13357 (2006.01)
H01L 25/075 (2006.01)
(Continued)

(52) U.S. Cl.
CPC .... *G02F 1/133603* (2013.01); *H01L 25/0753* (2013.01); *G02F 1/133612* (2021.01); *H01L 33/54* (2013.01); *H01L 33/56* (2013.01)

(58) Field of Classification Search
CPC ......... G02F 1/133603; G02F 1/133606; G02F 1/133611
See application file for complete search history.

(56) References Cited

U.S. PATENT DOCUMENTS 7,641,352 B2 * 1/2010 Lin ................... G02F 1/133611
362/330
7,661,835 B2 * 2/2010 Chou ................... G09G 3/3406
362/225
(Continued)

FOREIGN PATENT DOCUMENTS

JP 2013-149542 A 8/2013
KR 10-2009-0053631 A 5/2009
(Continued)

OTHER PUBLICATIONS

International Search Report dated Apr. 19, 2022 by the International Searching Authority in counterpart International Patent Application No. PCT/KR2021/015075.

*Primary Examiner* — Andrew J Coughlin
(74) *Attorney, Agent, or Firm* — Sughrue Mion, PLLC

(57) ABSTRACT

A display apparatus including a light source; a display panel; an optical sheet. The light source including a first light source substrate and a second light source substrate spaced apart from the first light source substrate in a width direction. The light source is mounted on the light source module and a width of a region defined by half of a maximum brightness of a light profile of the light source, is set as a full width at half maximum brightness. A distance between a center of the first light source substrate in the width direction and a center of the second light source substrate in the width direction is referred to as a pitch, the full width at half maximum brightness of the light source and the pitch satisfy: 1.0≤full width at half maximum brightness/pitch≤2.0.

15 Claims, 12 Drawing Sheets

(51) Int. Cl.
  *G02F 1/1335* (2006.01)
  *H01L 33/56* (2010.01)
  *H01L 33/54* (2010.01)

(56) References Cited

U.S. PATENT DOCUMENTS

| | | | | |
|---|---|---|---|---|
| 8,531,492 | B2* | 9/2013 | Wallener | G02B 27/0087 |
| | | | | 345/690 |
| 8,550,646 | B2* | 10/2013 | Kwon | G02F 1/133603 |
| | | | | 362/249.02 |
| 9,019,445 | B2* | 4/2015 | Shimizu | G09G 3/3426 |
| | | | | 362/249.05 |
| 2006/0087827 | A1* | 4/2006 | Jung | G02B 19/0028 |
| | | | | 362/23.18 |

FOREIGN PATENT DOCUMENTS

| | | |
|---|---|---|
| KR | 10-1095637 B1 | 12/2011 |
| WO | 2008/132941 A1 | 11/2008 |
| WO | 2011/004623 A1 | 1/2011 |

* cited by examiner

DISPLAY APPARATUS

CROSS-REFERENCE TO RELATED APPLICATION(S)

This application is a bypass continuation application of International Application PCT/KR2021/015075 filed on Oct. 26, 2021, which claims priority to Korean Patent Application No. 10-2021-0100148, filed on Jul. 29, 2021, in the Korean Intellectual Property Office, the disclosures of which are incorporated herein in their entireties by reference.

TECHNICAL FIELD

The present disclosure relates to a display apparatus, and more particularly, to a display apparatus having an improved optical structure.

BACKGROUND ART

A display apparatus is a kind of an output apparatus that converts obtained or stored electrical information into visual information and displays the visual information to a user. Display apparatuses are used in various fields such as a home and a business place.

A display apparatus typically includes a monitor apparatus connected to a personal computer or a server computer, a portable computer apparatus, a navigation terminal apparatus, a general television apparatus, an Internet Protocol television (IPTV) apparatus, a portable terminal apparatus such as a smart phone, a tablet PC, a personal digital assistant (PDA) or a cellular phone, various display apparatuses used to reproduce images such as advertisements or movies in an industrial field, or various kinds of audio/video systems.

A display apparatus includes a light source module to convert the electrical information into the visual information, and the light source module may include a plurality of light sources that independently emitting light.

Each of the plurality of light sources includes, for example, a light-emitting diode (LED) or an organic light-emitting diode (OLED). For example, the LEDs or OLEDs may be mounted on a circuit board or substrate.

DISCLOSURE

Technical Problem

One aspect of the present disclosure provides a display apparatus capable of reducing a moiré phenomenon.

Another aspect of the present disclosure provides a display apparatus capable of improving brightness.

Technical Solution

According to an aspect of the disclosure, a display apparatus may include a light source configured to emit light; a display panel provided in front of the light source and configured to output the light emitted from the light source; an optical sheet disposed between the light source and the display panel; and a light source module disposed on a rear side of the optical sheet, wherein the light source module comprises a first light source substrate having an elongated shape and a second light source substrate having an elongated shape and spaced apart from the first light source substrate in a width direction. The light source may be mounted on the light source module, wherein a width of a region defined by half of a maximum brightness of a light profile of a lighting element of the light source, is set as a full width at half maximum brightness. A distance between a center of the first light source substrate in the width direction and a center of the second light source substrate in the width direction may be referred to as a pitch, the full width at half maximum brightness of the light source and the pitch satisfy: 1.0≤full width at half maximum brightness/pitch≤2.0.

The light source may include a first biased lighting element disposed on one side of the first light source substrate in the width direction, the first biased lighting element being spaced apart from the center of the first light source substrate in the width direction, and a second biased lighting element may be disposed on a side of the first light source substrate that is opposite to the first biased lighting element in the width direction, the second biased lighting element may be spaced apart from the center of the first light source substrate in the width direction and spaced apart from the first biased lighting element in a length direction of the first light source substrate.

The light source may include a first edge light source disposed adjacent to one end of the first light source substrate in the length direction and disposed at the center of the first light source substrate in the width direction, and a second edge light source disposed adjacent to an end of the first light source substrate that is opposite to the first edge light source in the length direction and disposed at the center of the first light source substrate in the width direction.

The light source may include a first edge light source disposed adjacent to one end of the first light source substrate in the length direction and disposed on one side of the first light source substrate in the width direction and is spaced apart from the center of the first light source substrate in the width direction, and a second edge light source disposed adjacent to an end of the first light source substrate that is opposite to the first edge light source in the length direction and disposed on a side of the first light source substrate that is opposite to the first edge light source in the width direction and is spaced apart from the center of the first light source substrate in the width direction.

The light source may include a third biased lighting element disposed on a same line as the first biased lighting element and is spaced apart from the first biased lighting element in the length direction of the first light source substrate, and a fourth biased lighting element disposed on a same line as the second biased lighting element and is spaced apart from the second biased lighting element in the length direction of the first light source substrate.

The second biased lighting element may be disposed between the first biased lighting element and the third biased lighting element along the length direction of the first light source substrate, and the fourth biased lighting element is disposed on a side of the third biased lighting element that is opposite to the second biased lighting element, along the length direction of the first light source substrate.

The first biased lighting element and the third biased lighting element may be spaced apart from each other at a first interval in the length direction of the first light source substrate, and the second biased lighting element and the fourth biased lighting element may be spaced apart from each other at a second interval in the length direction of the first light source substrate and respectively disposed at centers between the first biased lighting element and the third biased lighting element in the length direction of the first light source substrate.

the interval between the first biased lighting element and the second biased lighting element may be equal to an interval between the second biased lighting element and the third biased lighting element.

The interval between the first biased lighting element and the second biased lighting element may be less than or equal to half of the pitch.

The interval between the first biased lighting element and the second biased lighting element may be less than an interval between the second biased lighting element and the third biased lighting element.

The interval between the first biased lighting element and the second biased lighting element may be equal to an interval between the third biased lighting element and the fourth biased lighting element.

The display apparatus may include a module substrate configured to transmit a signal to the first light source substrate and the second light source substrate. The first light source substrate may be disposed on one side of the module substrate, and the light source module includes a third light source substrate disposed on a side of the module substrate that is opposite to the first light source substrate.

The display apparatus may further include a connector configured to electrically connect the module substrate and the light source module.

The full width at half maximum rightness of the light source may be set to be greater than or equal to an interval between the first biased lighting element and the second biased lighting element.

The light source may include a light-emitting diode; and an optical dome that is configured to cover the light-emitting diode and is made of silicone or epoxy resin.

According to another aspect of the disclosure, a display apparatus may include: a light source configured to emit light; a display panel provided in front of the light source and configured to output the light emitted from the light source; an optical sheet disposed between the light source and the display panel; and a light source module disposed on a rear side of the optical sheet, wherein the light source module comprises a first light source substrate having an elongated shape and a second light source substrate having an elongated shape and spaced apart from the first light source substrate in a width direction. The light source may be mounted on the light source module, wherein a width of a region defined by half of a maximum brightness of a light profile of the light source, is set as a full width at half maximum brightness. A distance between a center of the first light source substrate in the width direction and a center of the second light source substrate in the width direction may be a pitch The light source may include: a first biased lighting element disposed on one side of the first light source substrate in the width direction, the first biased lighting element being spaced apart from the center of the first light source substrate in the width direction; and a second biased lighting element disposed on a side of the first light source substrate that is opposite to the first biased lighting element in the width direction, the second biased lighting element being spaced apart from the center of the first light source substrate in the width direction and spaced apart from the first biased lighting element in a length direction of the first light source substrate. An interval between the first biased lighting element and the second biased lighting element is less than or equal to half of the pitch.

The light source may further include a third biased lighting element disposed on a same line as the first biased lighting element and is spaced apart from the first biased lighting element in the length direction of the first light source substrate, and a fourth biased lighting element disposed on a same line as the second biased lighting element and is spaced apart from the second biased lighting element in the length direction of the first light source substrate.

An interval between the first biased lighting element and the second biased lighting element may be less than an interval between the second biased lighting element and the third biased lighting element, and interval between the first biased lighting element and the second biased lighting element may be equal to an interval between the third biased lighting element and the fourth biased lighting element.

The second biased lighting element may be disposed between the first biased lighting element and the third biased lighting element along the length direction of the first light source substrate, and the fourth biased lighting element may be disposed on a side of the third biased lighting element that is opposite to the second biased lighting element, along the length direction of the first light source substrate.

The first biased lighting element and the third biased lighting element may be spaced apart from each other at a first interval in the length direction of the first light source substrate, and the second biased lighting element and the fourth biased lighting element may be spaced apart from each other at a second interval in the length direction of the first light source substrate and respectively disposed at centers between the first biased lighting element and the third biased lighting element in the length direction of the first light source substrate.

Advantageous Effects

In a display apparatus according to an aspect of the present disclosure, a ratio of a full width at half maximum (FWHM) of a light source and a distance between a plurality of light source substrates can satisfy a predetermined range, thereby reducing a moiré phenomenon.

In a display apparatus according to an aspect of the present disclosure, a ratio of an interval between a plurality of light sources and a distance between a plurality of light source substrates can satisfy a predetermined range, thereby improving brightness.

MODES OF THE INVENTION

Figure 1:
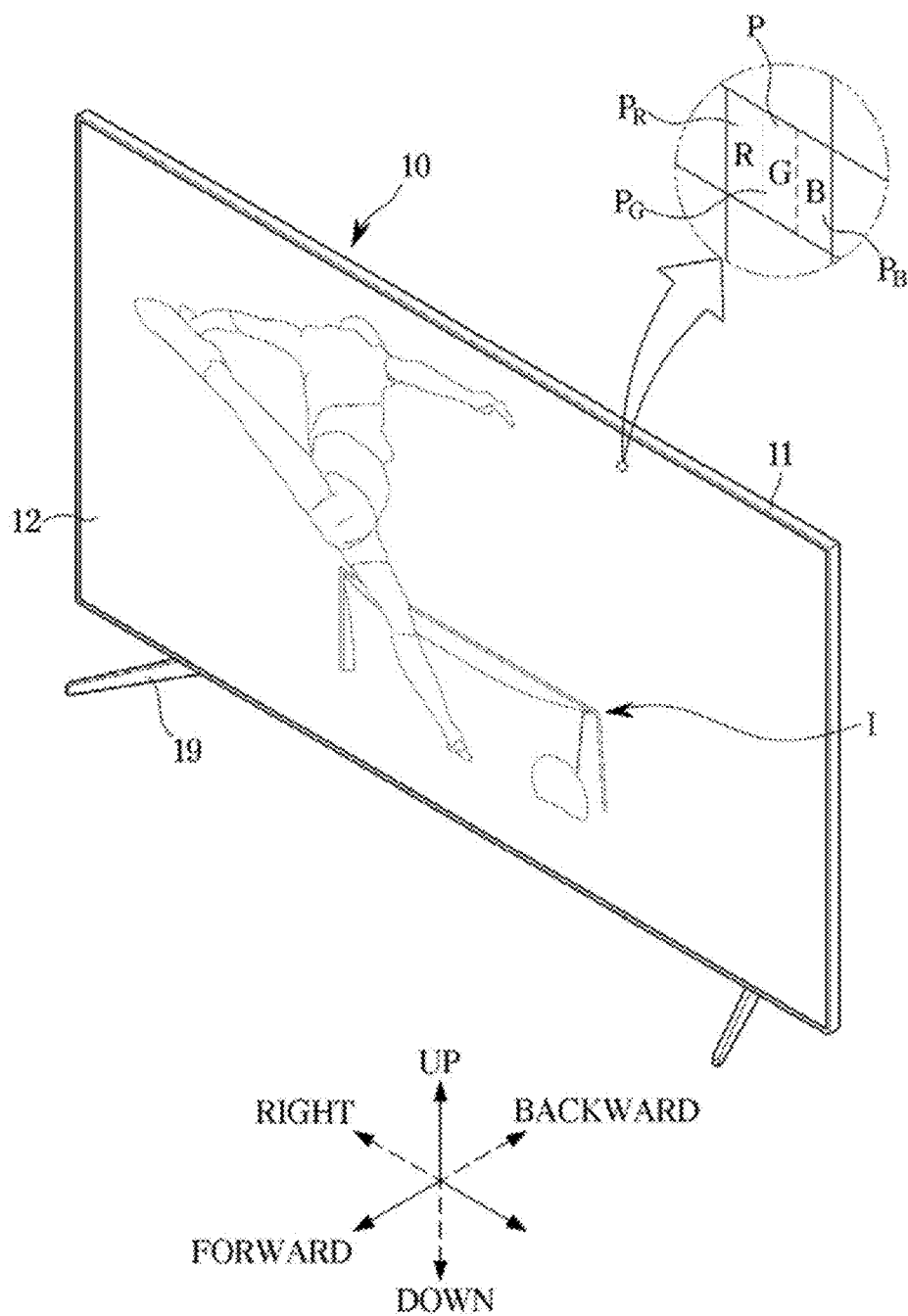
FIG. 1 is a view illustrating an exterior of a display apparatus according to an embodiment.

Throughout the specification, like reference numerals refer to like elements. The present specification does not describe all components of embodiments, and common descriptions in the technical field to which the present invention pertains and redundant descriptions between the embodiments will be omitted. Terms such as "unit," "module," "member," and "block" used herein may be implemented as software or hardware, and according to embodiments, a plurality of "units," "modules," "members," and "blocks" may be implemented as a single component or a single "unit," "module," "member," or "block" may include a plurality of components.

Throughout the specification, when a part is referred to as being "connected" to other parts, it includes not only a direct connection but also an indirect connection, and the indirect connection may include a connection through a wireless communication network.

It will be understood that the terms "comprises", "comprising", "includes" and/or "including", when used herein, specify the presence of stated elements, but do not preclude the presence or addition of one or more other elements, unless otherwise indicated herein. As used herein, the term "unit" or "module" denotes an entity for performing at least one function or operation, and may be implemented as hardware, software, or a combination of hardware and software.

Throughout the specification, when a member is referred to as being "on" another member, this description includes not only when the member is in contact with another member, but also when still another member is present between the member and another member.

Terms "first," "second," and the like are used to distinguish one component from other components, and components are not limited by these terms.

The singular forms include plural forms unless the context clearly notes otherwise.

A reference numeral attached in each of operations is used for convenience of description, and this reference numeral does not describe the order of the operations, and the operations may be differently performed from the described order unless clearly specified in the context.

Hereinafter, an operation principle and embodiments of the present disclosure will be described with reference to the accompanying drawings.

FIG. 1 is a view showing an exterior of a display apparatus according to one embodiment.

A display apparatus 10 is an apparatus that may process an image signal received from the outside and visually display the processed image. Hereinafter, a case in which the display apparatus 10 is a television (TV) is exemplified, but the present disclosure is not limited thereto. For example, the display apparatus 10 may be implemented in various forms such as a monitor, a portable multimedia apparatus, and a portable communication apparatus, and the display apparatus 10 is not limited in its form as long as the display apparatus visually displays an image.

In addition, the display apparatus 10 may be a large format display (LFD) installed outdoors, such as on a roof of a building or at a bus stop. Here, the outdoors is not necessarily limited to the outdoors, and the display apparatus 10 according to one embodiment may be installed wherever a large number of people may enter and exit, even indoors such as at subway stations, shopping malls, movie theaters, companies, and stores.

The display apparatus 10 may receive content data including video data and audio data from various content sources and output video and audio corresponding to the video data and audio data. For example, the display apparatus 10 may receive content data through a broadcast reception antenna or a wired cable, receive content data from a content playback apparatus, or receive content data from a content-providing server of a content provider.

As shown in FIG. 1, the display apparatus 10 may include a body 11, a screen 12 displaying an image I, and a support 19 provided below the body 11 to support the body 11.

The body 11 may form the exterior of the display apparatus 10, and the body 11 may include a component configured to allow the display apparatus 10 to display the image I or a component configured to perform various functions. The body 11 shown in FIG. 1 has a flat plate shape, but the shape of the body 11 is not limited to that shown in FIG. 1. For example, the body 11 may have a curved plate shape.

The screen 12 may be formed on a front surface of the body 11 and may display the image I. For example, the screen 12 may display a still image or a video. In addition, the screen 12 may display a two-dimensional plane image or a three-dimensional stereoscopic image using binocular parallax of a user.

The screen 12 may include, for example, a self-luminous panel that may emit light by itself (e.g., a light-emitting diode (LED) panel or an organic light-emitting diode (OLED) panel) or a non-self-luminous panel (e.g., a liquid crystal panel) that may transmit or block light emitted by a light source device (e.g., a backlight unit) or the like.

A plurality of pixels P may be formed on the screen 12, and the image I displayed on the screen 12 may be formed by light emitted from each of the plurality of pixels P. For example, the image I may be formed on the screen 12 by combining light emitted from the plurality of pixels P like a mosaic.

Each of the plurality of pixels P may emit light of various brightness and various colors. In order to emit light of various colors, each of the plurality of pixels P may include sub-pixels $P_R$, $P_G$, and $P_B$.

The sub-pixels $P_R$, $P_G$, and $P_B$ may include a red sub-pixel $P_R$ capable of emitting red light, a green sub-pixel $P_G$ capable of emitting green light, and a blue sub-pixel $P_B$ capable of emitting blue light. For example, the red light may represent light having a wavelength of approximately 620 nm (nanometers, one billionth of a meter) to 750 nm, the green light may represent light having a wavelength of approximately 495 nm to 570 nm, and the blue light may represent light having a wavelength of approximately 450 nm to 495 nm.

By combining the red light of the red sub-pixel $P_R$, the green light of the green sub-pixel $P_G$, and the blue light of the blue sub-pixel $P_B$, each of the plurality of pixels P may emit light of various brightness and various colors.

Figure 2:
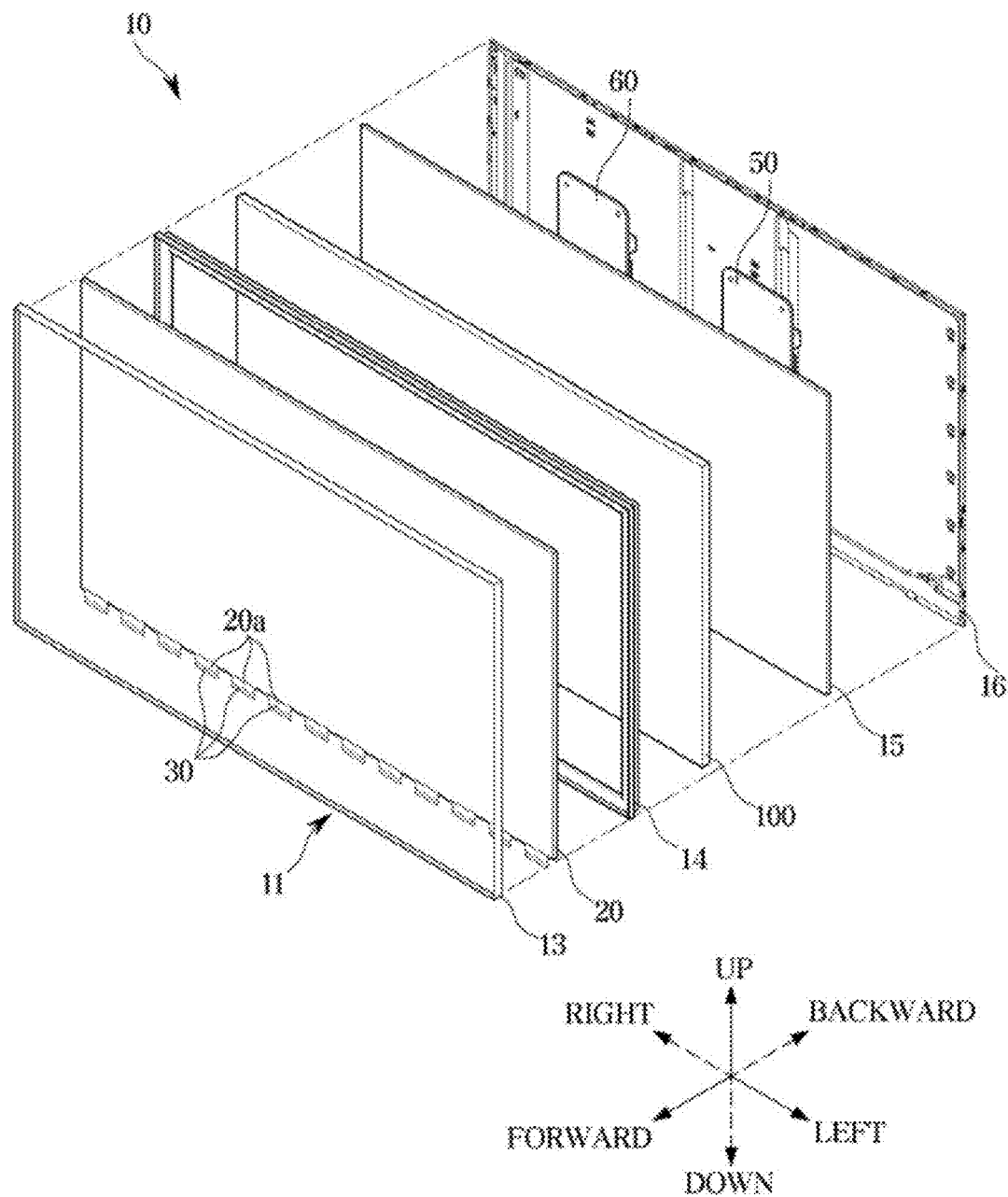
FIG. 2 is an exploded view illustrating the display apparatus shown in FIG. 1, according to an embodiment.

FIG. 2 is an exploded view of the display apparatus shown in FIG. 1, according to an embodiment.

As shown in FIG. 2, various components for generating the image I on the screen 12 may be provided in the body 11.

For example, the body 11 may include a light source device 100 which is a surface light source, a display panel 20 configured to block or transmit light emitted from the light source device 100, a control assembly 50 configured to control operations of the light source device 100 and the display panel 20, and a power supply assembly 60 configured to supply power to the light source device 100 and the display panel 20. In addition, the body 11 may include a bezel 13, a frame middle mold 14, a bottom chassis 15, and a rear cover 16 for supporting and fixing the display panel 20, the light source device 100, the control assembly 50, and the power supply assembly 60.

The light source device 100 may include a point light source that emits monochromatic light or white light, and may refract, reflect, and scatter the light to convert the light emitted from the point light source into a uniform surface light. For example, the light source device 100 may include a plurality of light sources configured to emit the monochromatic light or white light, a diffuser plate configured to diffuse the light incident from the plurality of light sources, a reflective sheet configured to reflect the light emitted from a rear surface of the diffuser plate and the plurality of light sources, and an optical sheet configured to refract and scatter the light emitted from a front surface of the diffuser plate.

As such, the light source device 100 may emit a uniform surface light toward the front by refracting, reflecting, and scattering the light emitted from the light source.

The configuration of the light source device 100 will be described in more detail below.

Figure 3:
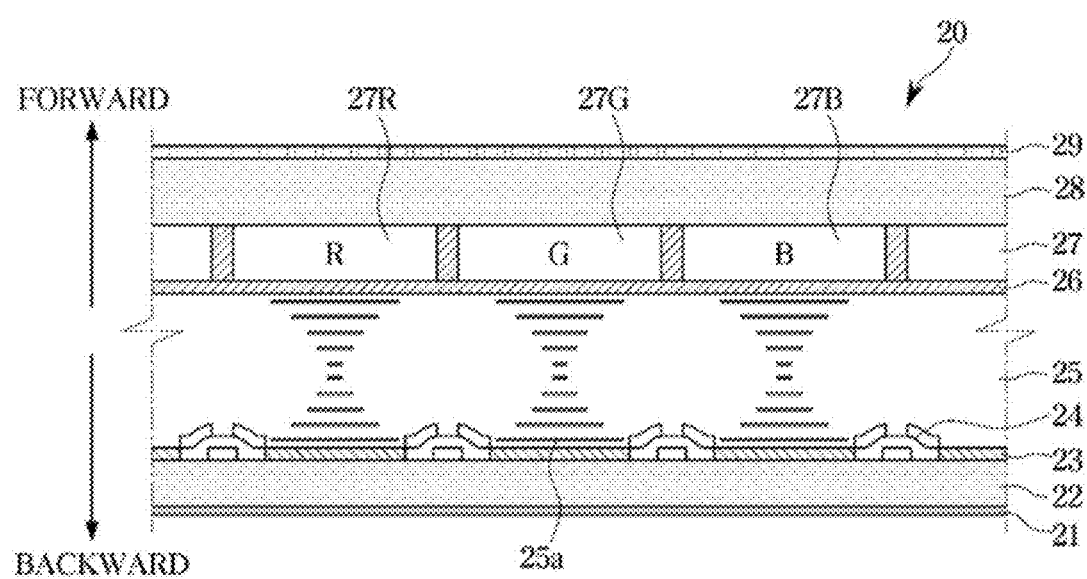
FIG. 3 is a view illustrating a display panel shown in FIG. 2, according to an embodiment.

FIG. 3 is a diagram showing a cross-section of the display panel shown in FIG. 2, according to an embodiment.

The display panel 20 may be provided in front of the light source device 100, and may block or transmits light emitted from the light source device 100 to form the image I.

A front surface of the display panel 20 may form the screen 12 of the display apparatus 10 described above, and the display panel 20 may include the plurality of pixels P. The plurality of pixels P included in the display panel 20 may independently block or transmit the light emitted from the light source device 100, and the light transmitted by the plurality of pixels P may form the image I to be displayed on the screen 12.

For example, as shown in FIG. 3, the display panel 20 may include a first polarizing film 21, a first transparent substrate 22, a pixel electrode 23, a thin-film transistor (TFT) 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin-film transistor 24, the liquid crystal layer 25, the common electrode 26, and the color filter 27. The first and second transparent substrates 22 and 28 may be made of tempered glass or transparent resin.

The first polarizing film 21 and the second polarizing film 29 may be provided on outer sides of the first and second transparent substrates 22 and 28, respectively.

The first polarizing film 21 and the second polarizing film 29 may be provided on the outer sides of the first and second transparent substrates 22 and 28, respectively. The first polarizing film 21 and the second polarizing film 29 may transmit specific polarized light and block (reflect or absorb) the other polarized light, respectively. For example, the first polarizing film 21 may transmit light polarized in a first direction and block (reflect or absorb) the other polarized light. In addition, the second polarizing film 29 may transmit light polarized in a second direction and block (reflect or absorb) the other polarized light. In this case, the first direction and the second direction may be orthogonal to each other. Thus, the polarized light passing through the first polarizing film 21 may not directly pass through the second polarizing film 29.

The color filter 27 may be provided on an inner side of the second transparent substrate 28. The color filter 27 may include a red filter 27R configured to transmit red light, a green filter 27G configured to transmit green light, and a blue filter 27B configured to transmit blue light. In addition, the red filter 27R, the green filter 27G, and the blue filter 27B may be disposed parallel to each other. A region in which the color filter 27 is formed may correspond to the pixel P described above. A region in which the red filter 27R is formed may correspond to the red sub-pixel $P_R$, a region in which the green filter 27G is formed may correspond to the green sub-pixel $P_G$, and a region in which the blue filter 27B is formed may correspond to the blue sub-pixel $P_B$.

The pixel electrode 23 may be provided on an inner side of the first transparent substrate 22, and the common electrode 26 may be provided on the inner side of the second transparent substrate 28. The pixel electrode 23 and the common electrode 26 may be made of a metal material through which electricity is conducted and may generate an electric field for changing the arrangement of liquid crystal molecules 115a constituting the liquid crystal layer 25 to be described below.

The thin-film transistor 24 may be provided on the inner side of the first transparent substrate 22. The thin-film transistor 24 may be turned on (closed) or off (opened) by image data provided from a panel driver 30. In addition, by turning the thin-film transistor 24 on (closing) or off (opening), an electric field may be formed or removed from between the pixel electrode 23 and the common electrode 26.

The liquid crystal layer 25 may be formed between the pixel electrode 23 and the common electrode 26 and may be filled with the liquid crystal molecules 25a. The liquid crystal represents an intermediate state between a solid (crystal) and a liquid. The liquid crystal may exhibit optical properties depending on a change of the electric field. For example, an arrangement direction of the molecules constituting the liquid crystal may change depending on the change of the electric field. As a result, optical properties of the liquid crystal layer 25 may change according to the presence or absence of the electric field passing through the liquid crystal layer 25. For example, the liquid crystal layer 25 may rotate a polarization direction of light about an optical axis according to the presence or absence of the electric field. Accordingly, the polarized light that has passed through the first polarizing film 21 may be changed in polarization direction while passing through the liquid crystal layer 25 and may pass through the second polarizing film 29.

A cable 20a through which image data is transmitted to the display panel 20 and a display driver integrated circuit (DDI) 30 (hereinafter, referred to as the "panel driver") configured to process digital image data and output an analog image signal are provided on one side of the display panel 20.

The cable 20a may electrically connect between the control assembly 50/power supply assembly 60 and the panel driver 30 and may also electrically connect between the panel driver 30 and the display panel 20. The cable 20*a* may include a flexible flat cable, a film cable, or the like that may be bendable.

The panel driver 30 may receive image data and power from the control assembly 50/the power supply assembly 60 through the cable 20*a*. Further, the panel driver 30 may provide image data and driving current to the display panel 20 through the cable 20*a*.

Further, the cable 20*a* and the panel driver 30 may be integrally implemented as a film cable, a chip on film (COF), a tape carrier package (TCP), or the like. In other words, the panel driver 30 may be disposed on the cable 20*a*. However, the present disclosure is not limited thereto, and the panel driver 30 may be disposed on the display panel 20.

The control assembly 50 may include a control circuit configured to control operations of the display panel 20 and the light source device 100. The control circuit may process image data received from an external content source, transmit the image data to the display panel 20, and transmit dimming data to the light source device 100.

The power supply assembly 60 may include a power supply circuit configured to supply power to the display panel 20 and the light source device 100. The power supply circuit may supply power to the control assembly 50, the light source device 100, and the display panel 20.

The control assembly 50 and the power supply assembly 60 may be implemented with a printed circuit board and various circuits mounted on the printed circuit board. For example, the power supply circuit may include a condenser, a coil, a resistance element, a processor, and the like and a power supply circuit board on which these elements are mounted. In addition, the control circuit may include a memory, a processor, and a control circuit board on which these elements are mounted.

Figure 4:
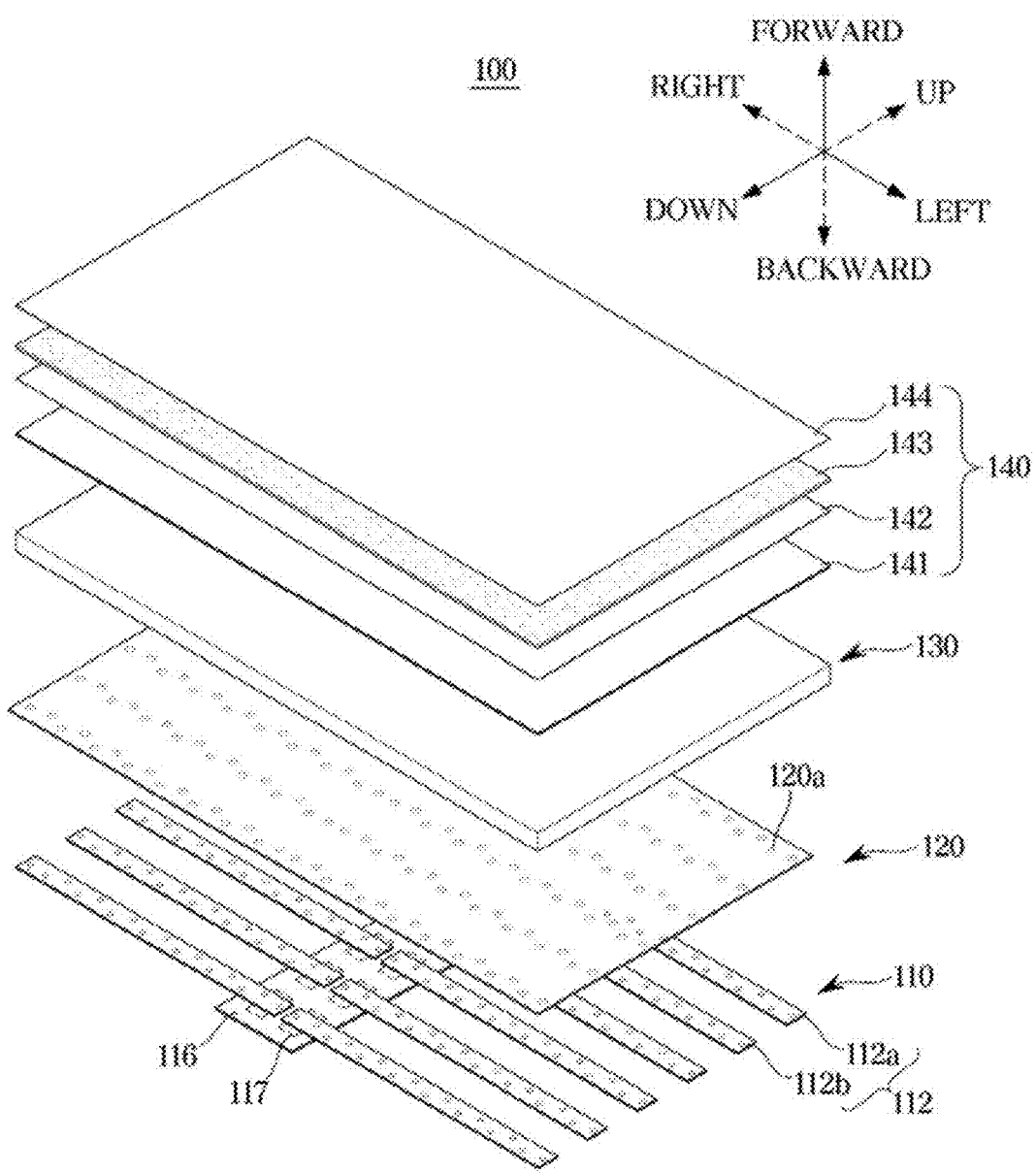
FIG. 4 is an exploded view illustrating a light source device shown in FIG. 2, according to an embodiment.
Figure 5:
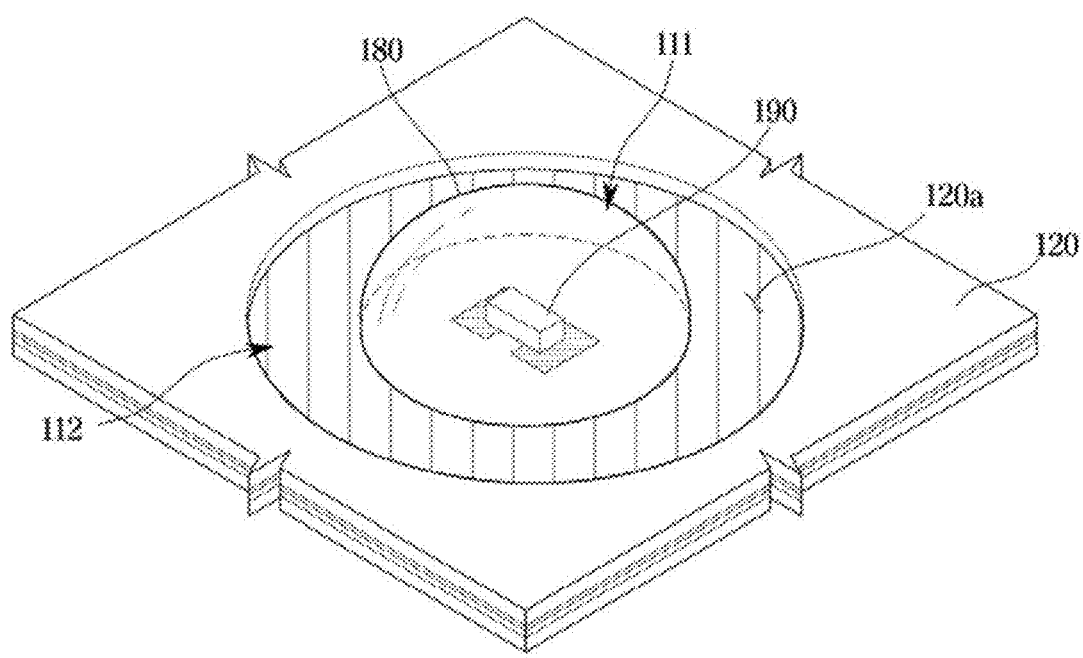
FIG. 5 is an enlarged view illustrating a portion of a light source module shown in FIG. 4, according to an embodiment.

FIG. 4 is an exploded view of the light source device shown in FIG. 2, according to an embodiment. FIG. 5 is an enlarged view showing a portion of the light source module shown in FIG. 4, according to an embodiment.

The light source device 100 may include a light source module 110 configured to generate light, a reflective sheet 120 configured to reflect the light, a diffuser plate 130 configured to uniformly diffuse the light, and an optical sheet 140 configured to improve brightness of the emitted light.

The light source module 110 may include a plurality of light sources 111 (or lighting elements) configured to emit light and light source substrates 112 (or light source module) configured to support/fix the plurality of light sources 111.

The plurality of light sources 111 may be disposed in a predetermined pattern to allow the emitted light to have uniform brightness. The plurality of light sources 111 may be disposed such that intervals between one light source and the light sources adjacent thereto become equal to each other. Alternatively, the plurality of light sources 111 may be disposed such that the intervals between one light source and the light sources adjacent thereto become different from each other.

The light sources 111 may employ an element configured to emit monochromatic light (light having a specific range of wavelengths or light with one peak wavelength, for example, blue light) or white light (i.e., light having a plurality of peak wavelengths, for example, mixed light of red light, green light, and blue light) in various directions when power is supplied.

As shown in FIG. 5, each of the plurality of light sources 111 may include a light-emitting diode 190 and an optical dome 180.

In order to reduce a thickness of the display apparatus 10, a thickness of the light source device 100 may also be reduced. In order to reduce the thickness of the light source device 100, each of the plurality of light sources 111 is thinned and a structure thereof is simplified.

The light-emitting diode 190 may be directly attached to the light source substrate 112 in a chip on board (COB) manner. For example, the light source 111 may include the light-emitting diode 190 in which an LED chip or an LED die is directly attached to the light source substrate 112 without separate packaging.

The light-emitting diode 190 may be manufactured as a flip-chip type light-emitting diode. In the flip-chip type light-emitting diode 190, when a light-emitting diode, which is a semiconductor element, is attached to the light source substrate 112, an intermediate medium such as a metal lead (wire) or a ball grid array (BGA) is not used, and an electrode pattern of the semiconductor element may be directly fused to the light source substrate 112. As such, since the metal lead (wire) or BGA is omitted, the light source 111 including the flip-chip type light-emitting diode 190 may be miniaturized.

The flip-chip type light-emitting diode 190 that is directly fused to the light source substrate 112 in a COB manner has been described above, but the light source 111 is not limited to the flip-chip type light-emitting diode. For example, the light source 111 may include a package-type light-emitting diode.

The optical dome 180 may cover the light-emitting diode 190. The optical dome 180 may prevent or suppress damage to the light-emitting diode 190 due to an external mechanical action and/or damage to the light-emitting diode 190 due to a chemical action.

The optical dome 180 may have, for example, a dome shape obtained by cutting a sphere along a plane that does not include a center thereof, or may have a hemispherical shape obtained by cutting a sphere along a plane including a center thereof. A vertical cross-section of the optical dome 180 may have, for example, an arcuate or semi-circular shape.

The optical dome 180 may be made of silicone or epoxy resin. For example, molten silicone or molten epoxy resin may be ejected onto the light-emitting diode 190 through a nozzle or the like, and then the ejected silicone or epoxy resin may be cured to form the optical dome 180.

The optical dome 180 may have a diameter of about 10 mm or less and a height of about 5 mm or less. According to an embodiment, the optical dome 180 may have a diameter of about 3 mm or less and a height of about 1 mm or less.

The optical dome 180 may be optically transparent or semi-transparent. The light emitted from the light-emitting diode 190 may be emitted to the outside through the optical dome 180.

The dome-shaped optical dome 180 may refract light like a lens. For example, the light emitted from the light-emitting diode 190 may be diffused by being refracted by the optical dome 180.

As such, the optical dome 180 may protect the light-emitting diode 190 from the external mechanical action and/or the chemical or electrical action, as well as diffuse the light emitted from the light-emitting diode 190.

Although the optical dome 180 in the form of a silicone dome has been described above, the light source 111 is not limited to including the optical dome 180. For example, the light source 111 may include a lens to diffuse the light emitted from the light-emitting diode.

The light source substrate 112 may fix the plurality of light sources 111 so that a position of each of the light sources 111 is not changed. In addition, the light source substrate 112 may supply power to each of the light sources 111 to emit light.

The light source substrate 112 may be formed of a synthetic resin or tempered glass with conductive power supply lines formed therein, or a printed circuit board (PCB) to fix the plurality of light sources 111 and supply power to the light sources 111.

The reflective sheet 120 may reflect the light emitted from the plurality of light sources 111 in a forward direction or in a direction close to the forward direction.

A plurality of through-holes 120a may be formed in the reflective sheet 120 at positions respectively corresponding to the plurality of light sources 111 of the light source module 110. In addition, the light sources 111 of the light source module 110 may respectively pass through the through-holes 120a and protrude forward from the reflective sheet 120. Accordingly, the plurality of light sources 111 may each emit light in the forward direction from the reflective sheet 120. The reflective sheet 120 may reflect the light, which is emitted from the plurality of light sources 111 toward the reflective sheet 120, toward the diffuser plate 130.

The diffuser plate 130 may be provided in front of the light source module 110 and the reflective sheet 120 and may uniformly diffuse the light emitted from the light source 111 of the light source module 110.

As described above, the plurality of light sources 111 may be located in a plurality of places in a rear surface of the light source device 100. Although the plurality of light sources 111 may be disposed on the rear surface of the light source device 100 at regular intervals, non-uniformity of brightness may occur depending on the positions of the plurality of light sources 111.

The diffuser plate 130 may diffuse the light, which is emitted from the plurality of light sources 111, in the diffuser plate 130 to eliminate the non-uniformity of brightness due to the plurality of light sources 111. In other words, the diffuser plate 130 may uniformly emit non-uniform light of the plurality of light sources 111 toward the front.

The optical sheet 140 may include various sheets to improve brightness or uniformity of the brightness. For example, the optical sheet 140 may include a light conversion sheet 141, a diffuser sheet 142, a prism sheet 143, a reflective polarizing sheet 144, and the like.

The optical sheet 140 is not limited to the sheet or film shown in FIG. 4 and may include more various sheets or films, such as a protective sheet.

Figure 6:
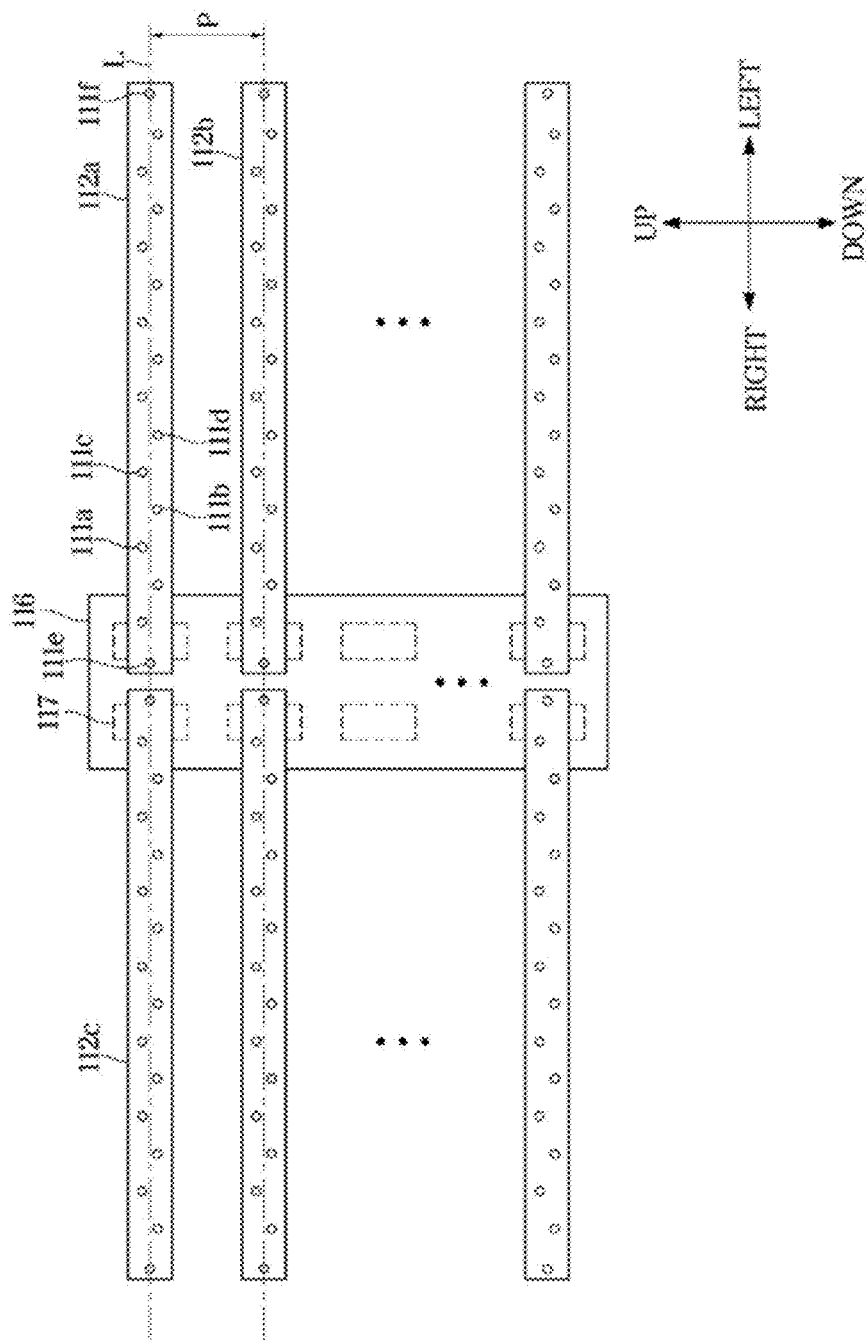
FIG. 6 is a schematic diagram of the light source module shown in FIG. 4, according to an embodiment.
Figure 7:
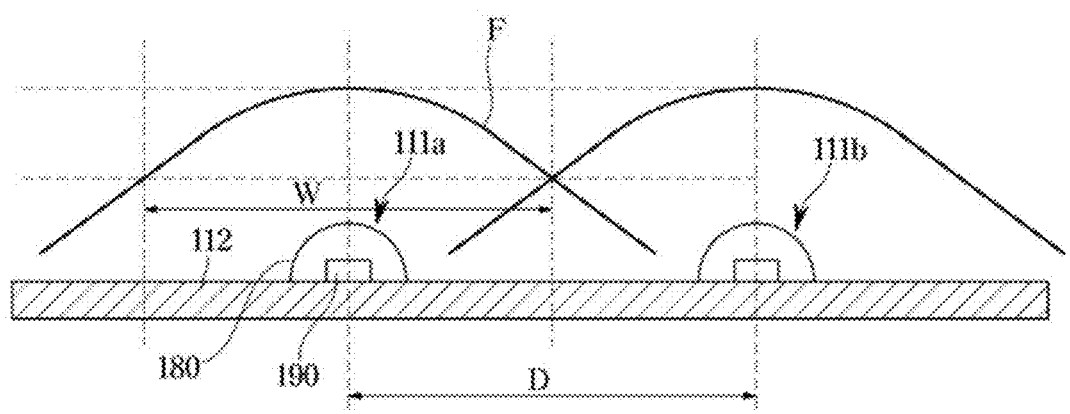
FIG. 7 is a schematic diagram of a light profile of a light source shown in FIG. 5, according to an embodiment.
Figure 8:
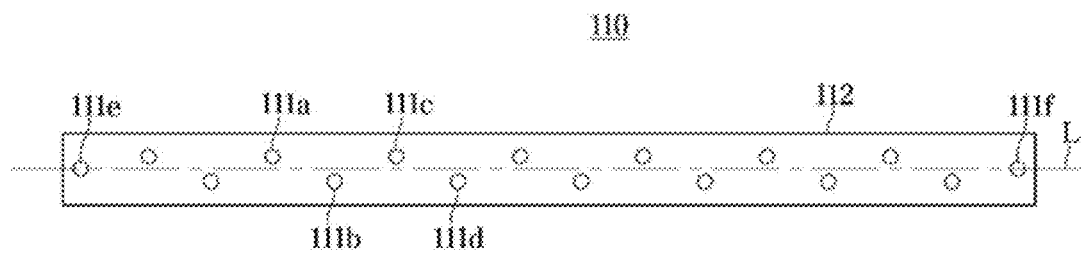
FIG. 8 is a view illustrating one of light source substrates shown in FIG. 5, according to an embodiment.

FIG. 6 is a schematic diagram of the light source module shown in FIG. 4, according to an embodiment. FIG. 7 is a schematic diagram of a light profile of the light source shown in FIG. 5, according to an embodiment. FIG. 8 is a shows one of the light source substrates of in FIG. 5, according to an embodiment.

Referring to FIG. 6, the light source module 110 may include a module substrate 116. The module substrate 116 may be configured to transmit signals to the light source substrates 112. The module substrate 116 may be electrically connected to the control assembly 50 and/or the power supply assembly 60. The module substrate 116 may be formed of a synthetic resin or tempered glass with conductive power supply lines formed thereon, or a PCB to supply power to the light sources 111.

The module substrate 116 may have a bar shape. The module substrate 116 may have long sides along a length direction (an up-down direction in coordinates shown in FIG. 4) and short sides along a width direction (a left-right direction in the coordinates shown in FIG. 4).

Referring to FIG. 6, the light source module 110 may include connectors 117. Each of the connectors 117 may be configured to electrically connect the light source substrate 112 to the module substrate 116. The connectors 117 may be provided to respectively correspond to the plurality of light source substrates 112 of the light source substrate 112.

Referring to FIG. 6, the light source module 110 may include the light source substrate 112. The light source substrate 112 may have a bar shape. The light source substrate 112 may have long sides along a length direction (the left-right direction in the coordinates shown in FIG. 4) and short sides along a width direction (the up-down direction in the coordinates shown in FIG. 4). The light source substrate 112 may include the plurality of light source substrates 112 continuously disposed along both long sides of the module substrate 116.

The plurality of light source substrates 112 may be disposed to be spaced apart from each other at predetermined intervals in the width direction of the light source substrate 112. As an example, a first light source substrate 112a may be disposed to be spaced apart from a second light source substrate 112b in the up-down direction. Specifically, the first light source substrate 112a may be disposed such that an imaginary center line L (see FIG. 8) of the first light source substrate 112a in the width direction is spaced apart from an imaginary center line L of the second light source substrate 112b in the width direction by a pitch P.

The plurality of light source substrates 112 may be disposed to be spaced apart from each other at a predetermined interval in the length direction of the light source substrate 112. As an example, the first light source substrate 112a may be disposed to be spaced apart from a third light source substrate 112c in the left-right direction. The first light source substrate 112a may be disposed on a left side of the module substrate 116, and the third light source substrate 112c may be disposed on a right side of the module substrate 116.

Referring to FIG. 7, in each of the plurality of light sources 111 disposed on the light source substrate 112, a width of a region, defined by half of a maximum brightness (in a front direction of the light-emitting diode 190) of a light profile F, is set as a full width at half maximum brightness W.

In the light source device 100 according to an embodiment of the present disclosure, the pitch P between the center line L of each of the first light source substrate 112a and the second light source substrate 112b and the full width at half maximum brightness of the light source 111 may satisfy a relational expression shown in Equation 1 below, $$1.0 <= \text{full width at half maximum brightness } W/\text{pitch } P <= 2.0 \quad \text{[Equation 1]}$$

Referring to FIG. 8, the plurality of light sources 111 may include a first biased light source 111a and a second biased light source 111b. The biased light sources may also be referred to as biased lighting elements.

The first biased light source 111a may be disposed on one side with respect to the imaginary center line L of the light source substrate 112 in the width direction to be spaced apart from the imaginary center line L. The first biased light source 111a may be disposed on an upper side with respect to the imaginary center line L of the light source substrate 112 in the width direction to be spaced apart from the imaginary center line L.

The second biased light source 111b may be disposed on the other side with respect to the imaginary center line L of the light source substrate 112 in the width direction to be spaced apart from the imaginary center line L. The second biased light source 111b may be disposed on a lower side with respect to the imaginary center line L of the light source substrate 112 in the width direction to be spaced apart from the imaginary center line L. The second biased light source 111b may be disposed to be spaced apart from the first biased light source 111a in the length direction of the light source substrate 112. That is, the second biased light source 111b may be disposed at a lower left side of the first biased light source 111a.

Referring to FIG. 7, an interval D between the first biased light source 111a and the second biased light source 111b may be set to be equal to the full width at half maximum brightness W of the plurality of light sources 111. The interval D between the first biased light source 111a and the second biased light source 111b may be set to be less than the full width at half maximum brightness W of the plurality of light sources 111.

The interval D between the plurality of light sources 111 and the pitch P, which is a distance between centers of the plurality of light source substrates 112 in the width direction, may satisfy a relational expression shown in Equation 2 below, $$\text{interval } D <= 0.5 * \text{pitch } P \qquad [\text{Equation 2}].$$

In other words, in the display apparatus 10 according to an embodiment of the present disclosure, the plurality of light sources 111 may be disposed such that the interval D between the plurality of light sources 111 is less than half of the pitch P, which is the distance between the centers of the plurality of light source substrates 112 in the width direction. With such a configuration, the display apparatus 10 according to an embodiment of the present disclosure may allow brightness to be improved.

Referring to FIG. 8, the plurality of light sources 111 may include a third biased light source 111c disposed on the same line as the first biased light source 111a in the length direction of the light source substrate 112. The third biased light source 111c may be disposed to be spaced apart from the first biased light source 111a in the length direction of the light source substrate 112.

The plurality of light sources 111 may include a fourth biased light source 111d disposed on the same line as the second biased light source 111b in the length direction of the light source substrate 112. The fourth biased light source 111d may be disposed to be spaced apart from the second biased light source 111b in the length direction of the light source substrate 112. The fourth biased light source 111d may be disposed to be spaced apart from the third biased light source 111c in the length direction of the light source substrate 112. That is, the fourth biased light source 111d may be disposed at a lower left side of the third biased light source 111c.

An interval between the first biased light source 111a and the second biased light source 111b may be equal to an interval between the third biased light source 111c and the fourth biased light source 111d.

The interval between the second biased light source 111b and the first biased light source 111a may be equal to an interval between the second biased light source 111b and the third biased light source 111c.

The plurality of light sources 111 may be provided in a manner in which the first to fourth biased light source 111a to 111d are repeated. The number of the plurality of light sources 111 provided on the light source substrate 112 may be based on the application.

The plurality of light sources 111 may include a first edge light source 111e disposed adjacent to one end of the light source substrate 112 in the length direction. The first edge light source 111e may be disposed on a right side end portion of the light source substrate 112. The first edge light source 111e may be disposed at the center of the light source substrate 112 in the width direction.

The plurality of light sources 111 may include a second edge light source 111f disposed adjacent to the other end of the light source substrate 112 in the length direction. The second edge light source 111f may be disposed on a left side end portion of the light source substrate 112. The second edge light source 111f may be disposed at the center of the light source substrate 112 in the width direction.

As the first edge light source 111e and the second edge light source 111f are disposed on the imaginary center line L on the light source substrate 112 in the width direction, brightness uniformity of the edge portion of the screen 12 may be improved in the display apparatus 10 according to one embodiment of the present disclosure.

In the above description, for convenience of description, only the first biased light source 111a, the second biased light source 111b, the third biased light source 111c, and the fourth biased light source 111d are described, but the first biased light source 111a, the second biased light source 111b, the third biased light source 111c, and the fourth biased light source 111d may be alternately and continuously disposed along the length direction of the light source substrate 112.

Figure 9:
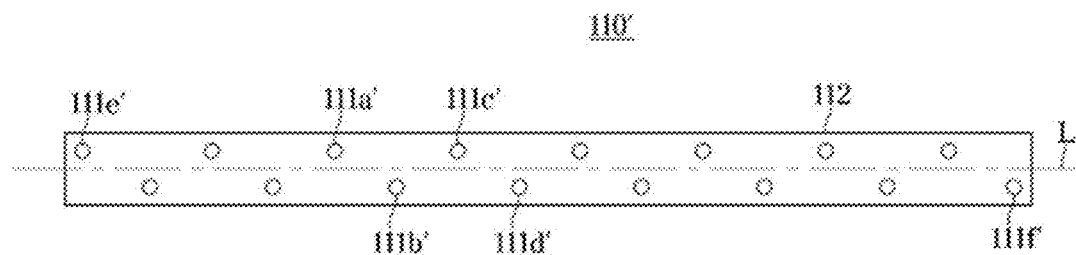
FIG. 9 is a view illustrating one of light source substrates of a light source device according to another embodiment.

FIG. 9 is a diagram showing one of light source substrates of a light source device according to another embodiment.

Referring to FIG. 9, a light source device 110' may include a first biased light source 111a', a second biased light source 111b', a third biased light source 111c', and a fourth biased light source 111d'. The first biased light source 111a', the second biased light source 111b', the third biased light source 111c', and the fourth biased light source 111d' may be provided in the same manner as the first biased light source 111a, the second biased light source 111b, the third biased light source 111c, and the fourth biased light source 111d shown in FIG. 8.

The light source device 110' may include a first edge light source 111e' and a second edge light source 111f'.

The first edge light source 111e' may be disposed adjacent to one end of a light source substrate 112 in a length direction. The first edge light source 111e' may be disposed on a right side end portion of the light source substrate 112.

Unlike the embodiment described of FIG. 8, the first edge light source 111e' may be disposed on one side with respect to a center of the light source substrate 112 in a width direction to be spaced apart from the center of the light source substrate 112. The first edge light source 111e' may be disposed on an upper side with respect to an imaginary center line L of the light source substrate 112 in the width direction to be spaced apart from the imaginary center line L.

The second edge light source 111f' may be disposed adjacent to the other end of the light source substrate 112 in the length direction. The second edge light source 111f' may be disposed on a left side end portion of the light source substrate 112.

Unlike the embodiment described of FIG. 8, the second edge light source 111f' may be disposed on the other side with respect to the center of the light source substrate 112 in the width direction to be spaced apart from the center of the light source substrate 112. The second edge light source 111*f'* may be disposed on a lower side with respect to the imaginary center line L of the light source substrate 112 in the width direction to be spaced apart from the imaginary center line L.

When the first edge light source 111*e'* and the second edge light source 111*f'* are disposed to be spaced apart from the imaginary center line L of the light source substrate 112 in the width direction, the first edge light source 111*e'* and the second edge light source 111*f'* may be disposed closer to the bezel 13 than that in the embodiment described with reference to FIG. 8 in order to improve brightness uniformity of the edge portion of the screen 12.

Figure 10:
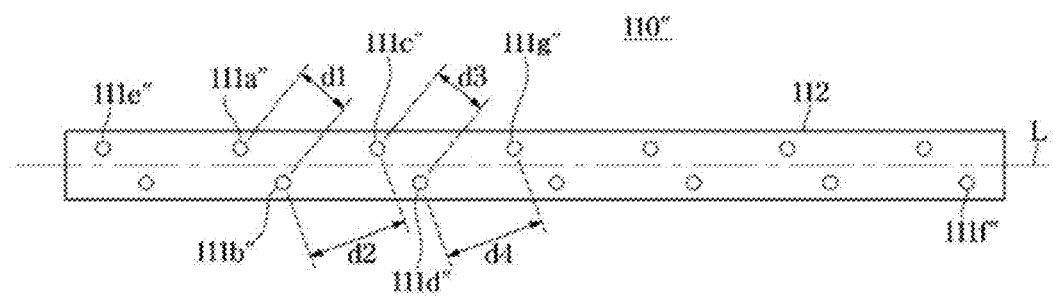
FIG. 10 is a view illustrating one of light source substrates of a light source device according to still another embodiment.

FIG. 10 is a diagram showing a light source substrates of a light source device according to still another embodiment.

Referring to FIG. 10, a light source device 100" according to still another embodiment of the present disclosure may include a first biased light source 111*a"*, a second biased light source 111*b"*, a third biased light source 111*c"*, a fourth biased light source 111*d"*, and a fifth biased light source 111*g"*.

The fifth biased light source 111*g"* may be disposed on the same line as the first biased light source 111*a"* and the third biased light source 111*c"* to be spaced apart therefrom in a length direction of the light source substrate.

The light source device 100" may include a first edge light source 111*e"* and a second edge light source 111*f'*. The first edge light source 111*e"* and the second edge light source 111*f'* may be disposed to be spaced apart from an imaginary center line L of a light source substrate 112 in a length direction like the first edge light source 111*e'* and the second edge light source 111*f'* shown in FIG. 9.

An interval d1 between the first biased light source 111*a"* and the second biased light source 111*b"* may be equal to an interval d3 between the third biased light source 111*c"* and the fourth biased light source 111*d"*. An interval d2 between the second biased light source 111*b"* and third biased light source 111*c"* may be equal to an interval d4 between the fourth biased light source 111*d"* and the fifth biased light source 111*g"*.

Unlike the embodiment of FIG. 8, the interval d1 between the second biased light source 111*b"* and the first biased light source 111*a"* may be less than the interval d2 between the second biased light source 111*b"* and the third biased light source 111*c"*. That is, the first biased light source 111*a"* and the second biased light source 111*b"* may be grouped to emit light as one light source, and the third biased light source 111*c"* and the fourth biased light source 111*d"* may be grouped to emit light as one light source. With such a configuration, when the light source device 100" is applied to the display apparatus 10, brightness uniformity may be improved.

Figure 11:
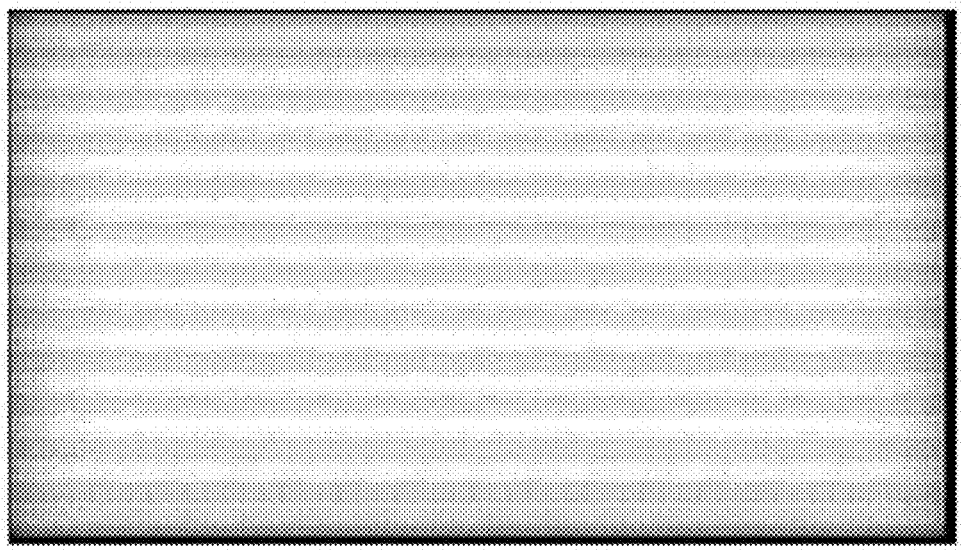
FIG. 11 is a view illustrating experimental results when a ratio of a full width at half maximum of the light source of the light source device and a pitch between a plurality of light source substrates deviates from a range of the present invention.
Figure 12:
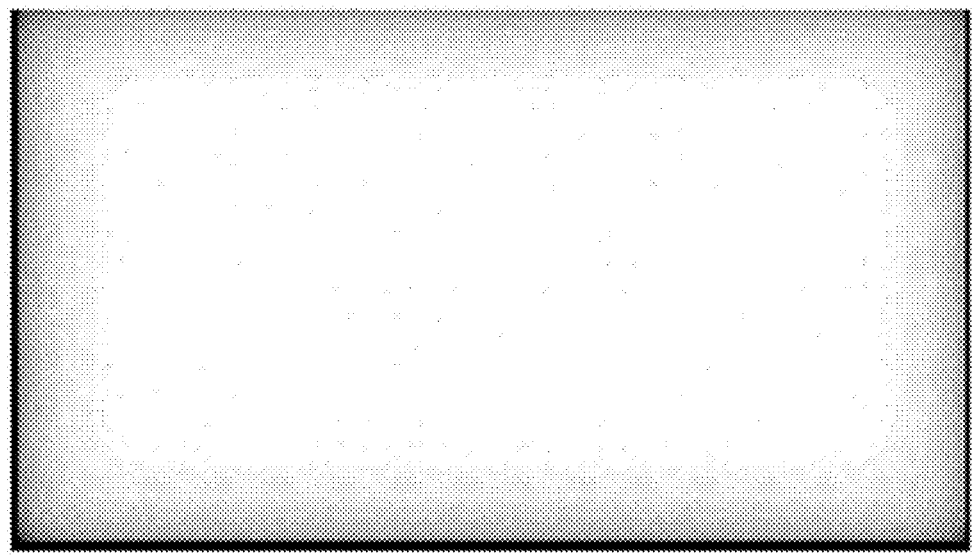
FIG. 12 is a view illustrating experimental results when the ratio of the full width at half maximum of the light source of the light source device and the pitch between the plurality of light source substrates is in the range of the present invention.

FIG. 11 is a diagram showing experimental results when a ratio of the full width at half maximum brightness of the light source of the light source device and the pitch between the plurality of light source substrates is out of a range of the present disclosure. FIG. 12 is a diagram showing experimental results when the ratio of the full width at half maximum brightness of the light source of the light source device and the pitch between the plurality of light source substrates is in the range of Equation 1.

Effects of the display apparatus 10 will be described with reference to FIGS. 11 and 12.

Referring to FIG. 11, when a ratio of the full width at half maximum brightness W of the light source 111 of the light source module 110, 110', or 110" and the pitch P, which is a distance between the centers of the plurality of light source substrates 112 in the width direction, is out of the range of Equation 1, a moiré phenomenon occurs.

Specifically, when the full width at half maximum brightness W/pitch P is less than 1.0, the moiré phenomenon occurs more easily.

In contrast, when the full width at half maximum brightness W/pitch P is greater than 2.0, the moiré phenomenon may be reduced, but the number of required light source substrates 112 is increased to increase costs.

However, referring to FIG. 12, when the ratio of the full width at half maximum brightness W of the light source 111 of the light source device 100, 100', or 100" and the pitch P, which is a distance between the centers of the plurality of light source substrates 112 in the width direction, satisfies the range of Equation 1, the moiré phenomenon may be reduced.

Hereinbefore, the disclosed embodiments have been described with reference to the accompanying drawings. It would be appreciated by those skilled in the art to which the disclosed embodiments pertain that other forms different from the disclosed embodiments can be implemented without departing from the technical spirit and essential features of the disclosed embodiments. The disclosed embodiments are illustrative and should not be construed as limiting.

The invention claimed is:

1. A display apparatus comprising:
a light source configured to emit light;
a display panel provided in front of the light source and configured to output the light emitted from the light source;
an optical sheet disposed between the light source and the display panel; and
a light source module disposed on a rear side of the optical sheet, wherein the light source module comprises a first light source substrate having an elongated shape and a second light source substrate having an elongated shape and spaced apart from the first light source substrate in a width direction,
wherein the light source is mounted on the light source module, wherein a width of a region defined by half of a maximum brightness of a light profile of a lighting element of the light source, is set as a full width at half maximum brightness, and
wherein a distance between a center of the first light source substrate in the width direction and a center of the second light source substrate in the width direction is a pitch, the full width at half maximum brightness of the light source and the pitch satisfy:

$$1.0 \leq \text{full width at half maximum brightness}/\text{pitch} \leq 2.0.$$

2. The display apparatus of claim 1, wherein the light source comprises a first biased lighting element disposed on one side of the first light source substrate in the width direction, the first biased lighting element being spaced apart from the center of the first light source substrate in the width direction, and
a second biased lighting element disposed on a side of the first light source substrate that is opposite to the first biased lighting element in the width direction, the second biased lighting element being spaced apart from the center of the first light source substrate in the width direction and spaced apart from the first biased lighting element in a length direction of the first light source substrate.

3. The display apparatus of claim 2, wherein the light source comprises a first edge light source disposed adjacent to one end of the first light source substrate in the length direction and disposed at the center of the first light source substrate in the width direction, and
  a second edge light source disposed adjacent to an end of the first light source substrate that is opposite to the first edge light source in the length direction and disposed at the center of the first light source substrate in the width direction.

4. The display apparatus of claim 2, wherein the light source comprises a first edge light source disposed adjacent to one end of the first light source substrate in the length direction and disposed on one side of the first light source substrate in the width direction and is spaced apart from the center of the first light source substrate in the width direction, and
  a second edge light source disposed adjacent to an end of the first light source substrate that is opposite to the first edge light source in the length direction and disposed on a side of the first light source substrate that is opposite to the first edge light source in the width direction and is spaced apart from the center of the first light source substrate in the width direction.

5. The display apparatus of claim 2, wherein the light source includes a third biased lighting element disposed on a same line as the first biased lighting element and is spaced apart from the first biased lighting element in the length direction of the first light source substrate, and
  a fourth biased lighting element disposed on a same line as the second biased lighting element and is spaced apart from the second biased lighting element in the length direction of the first light source substrate.

6. The display apparatus of claim 5, wherein the second biased lighting element is disposed between the first biased lighting element and the third biased lighting element along the length direction of the first light source substrate, and the fourth biased lighting element is disposed on a side of the third biased lighting element that is opposite to the second biased lighting element, along the length direction of the first light source substrate.

7. The display apparatus of claim 6, wherein
  the first biased lighting element and the third biased lighting element are spaced apart from each other at a first interval in the length direction of the first light source substrate, and
  the second biased lighting element and the fourth biased lighting element are spaced apart from each other at a second interval in the length direction of the first light source substrate and respectively disposed at centers between the first biased lighting element and the third biased lighting element in the length direction of the first light source substrate.

8. The display apparatus of claim 5, wherein an interval between the first biased lighting element and the second biased lighting element is equal to an interval between the second biased lighting element and the third biased lighting element.

9. The display apparatus of claim 8, wherein the interval between the first biased lighting element and the second biased lighting element is less than or equal to half of the pitch.

10. The display apparatus of claim 5, wherein an interval between the first biased lighting element and the second biased lighting element is less than an interval between the second biased lighting element and the third biased lighting element.

11. The display apparatus of claim 10, wherein the interval between the first biased lighting element and the second biased lighting element is equal to an interval between the third biased lighting element and the fourth biased lighting element.

12. The display apparatus of claim 2, wherein the full width at half maximum brightness of the light source is set to be greater than or equal to an interval between the first biased lighting element and the second biased lighting element.

13. The display apparatus of claim 1, further comprising a module substrate configured to transmit a signal to the first light source substrate and the second light source substrate,
  wherein the first light source substrate is disposed on one side of the module substrate, and
  the light source module includes a third light source substrate disposed on a side of the module substrate that is opposite to the first light source substrate.

14. The display apparatus of claim 13, further comprising a connector configured to electrically connect the module substrate and the light source module.

15. The display apparatus of claim 1, wherein the light source comprises:
  a light-emitting diode; and
  an optical dome that is configured to cover the light-emitting diode and is made of silicone or epoxy resin.

* * * * *